United States Patent
Gunasekaran et al.

(10) Patent No.: US 6,548,189 B1
(45) Date of Patent: Apr. 15, 2003

(54) EPOXY ADHESIVE

(75) Inventors: Somasundaram Gunasekaran, Bangalore (IN); Thomas Bert Gorczyca, Schenectady, NY (US); Herbert Stanley Cole, Burnt Hills, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/682,871

(22) Filed: Oct. 26, 2001

(51) Int. Cl.[7] .............................................. B32B 15/08
(52) U.S. Cl. ...................... 428/626; 257/793; 428/414; 428/620; 523/466; 525/524; 525/533; 528/94; 528/112
(58) Field of Search .......................... 523/466; 525/524; 525/533; 528/94, 112; 428/620, 626, 414; 257/793

(56) References Cited

U.S. PATENT DOCUMENTS

| | | |
|---|---|---|
| 4,292,214 A | 9/1981 | Blount |
| 4,367,326 A | 1/1983 | Blount |
| 4,525,542 A | 6/1985 | DeGooyer |
| 4,539,347 A | 9/1985 | DeGooyer |
| 4,608,405 A | 8/1986 | DeGooyer |
| 4,944,373 A | 7/1990 | Ohya et al. |
| 5,367,010 A | 11/1994 | Gervase et al. |
| 5,508,324 A | 4/1996 | Cook |
| 5,712,317 A * | 1/1998 | Makhlouf .................... 521/76 |
| 5,851,644 A | 12/1998 | McArdle et al. |
| 5,916,641 A | 6/1999 | McArdle et al. |
| 5,946,546 A | 8/1999 | Fillion et al. |
| 6,013,696 A | 1/2000 | Hill et al. |
| 6,139,673 A | 10/2000 | Sasaki et al. |
| 6,149,857 A | 11/2000 | McArdle et al. |
| 6,180,226 B1 | 1/2001 | McArdle et al. |
| 6,181,569 B1 | 1/2001 | Chakravorty |
| 6,255,137 B1 | 7/2001 | Gorczyca |

OTHER PUBLICATIONS

Chemical Abstracts Service, Cas reg file printout 140938–92–7, 1967.*
Kirk–Othmer Encyclopedia of Chemical Technology, Epoxy Resins, vol. 9, pp. 730–755; 1994.

* cited by examiner

Primary Examiner—Robert Dawson
Assistant Examiner—D. Aylward
(74) Attorney, Agent, or Firm—Fay, Sharpe, Fagan, Minnich & McKee, LLP

(57) ABSTRACT

In the present invention an adhesive composition is provided. The adhesive composition includes epoxidized cashew nutshell liquid, a catalyst, and diglycidyl ether of bisphenol A. The invention may further include at least one additive selected from the group including curing agents, bonding enhancers, hardeners, flexibilizers, tackifiers, and mixtures thereof.

18 Claims, 1 Drawing Sheet

EPOXY ADHESIVE

BACKGROUND OF INVENTION

The present invention relates to adhesive compositions. More specifically, the present invention relates to epoxy adhesive compositions.

The present invention relates to an epoxy-based adhesive formulation for electronics packaging. As one example, the present invention relates to an epoxy based adhesive formulation for chip-on-flex applications in electronic packaging. Chip-on-flex applications involve the placement of electronic chips onto flexible films, such as polyimide films, to form high density interconnect packages. Chip-on-flex applications are most often used in packaging of semiconductors.

An epoxy for this type of application should be homogeneous and have a good flow for uniform spin coatability, it should remain tacky after application to the flex and after partial cure or solvent removal so that chips or electronic components placed on it will be held in place, it should be laser ablatable so that adhesive-free pockets can be formed to provide areas to position electronic components which may contain sensitive structures or moveable components such as may be found in MEMs devices, it needs to be hydrophobic to prevent significant moisture absorption by the film in its partial cured state (moisture absorption will degrade the films cured properties) so that a long working life of the coated film is possible to allow time for ablation and chip placement, it must have a sufficient thixotropic character to avoid encroaching into the air pocket (if present) under the attached electronic devices and prevent movement of the electronic devices during final cure, it must provide a void-free attach for the electronic components during adhesive cure so that subsequent vias may be laser drilled down to contact pads on the chip components, it must provide good adhesion to both the flex film and the electronic components and it must have adequate absorption from 200 nm to about 400 nm to allow for laser ablation of the air pockets and via interconnects.

Adhesives in chip-on-flex applications are often laser ablated to provide a series of pores in the adhesive layer. Laser ablation provides protection for adhesive-sensitive or pressure-sensitive portions of semiconductor chips such as airbridge structures, which are liable to be crushed, and transmission-line or resonant structures, the properties of which may be affected by proximity to dielectric materials. This laser ablation allows the formation of integral air pockets in adhesive-free regions under devices attached directly to the adhesive surface. A suitable method of laser ablation is demonstrated in U.S. Pat. No. 6,255,137.

Unfortunately, commercially available epoxies produce large amounts of soot during the laser ablation process, leading to impurities in the electronic packaging. Furthermore, many commercially available epoxies do not presently provide adequate flow and thixotropic qualities. In addition, many commercially available epoxies are not sufficiently fast drying.

It would therefore be desirable to develop an improved fast drying epoxy based adhesive formulation which ablates with reduced soot generation, provides minimal encroachment into the ablated regions, and provides good chip adhesion.

SUMMARY OF INVENTION

According to one aspect of the invention an adhesive composition is provided. The adhesive composition includes epoxidized cashew nutshell liquid, a catalyst, and diglycidyl ether of bisphenol A. The invention may further include at least one additive selected from the group including curing agents, bonding enhancers, hardeners, flexibilizers, tackifiers, and mixtures thereof.

According to a further aspect of the invention, an adhesive formulation suitable for curing is provided. The formulation includes epoxidized cashew nutshell liquid, diglycidyl ether of besphenol A, and a curing agent. At least one additional additive selected from the group consisting of a bonding enhancer, a hardener, a flexibilizer, a tackifier, and mixtures thereof may also be included in the formulation.

According to a third aspect of the invention, an adhesive composition including the reaction product of epoxidized cashew nutshell liquid, diglycidyl ether of bisphenol A, a curing agent, and a catalyst is provided.

A method for forming an adhesive composition is also provided. The method includes the step of mixing together epoxidized cashew nutshell liquid, a catalyst, diglycidyl ether of bisphenol A, and optionally, at least one each of a curing agent, a bonding enhancer, a hardener, a flexibilizer, and a tackifier.

According to another embodiment of the invention, an electronic chip is provided. The chip includes a substrate; an adhesive including epoxidized cashew nutshell liquid, a catalyst, and diglycidyl ether of bisphenol A; and at least one semiconductor device.

DETAILED DESCRIPTION

Figure 1:
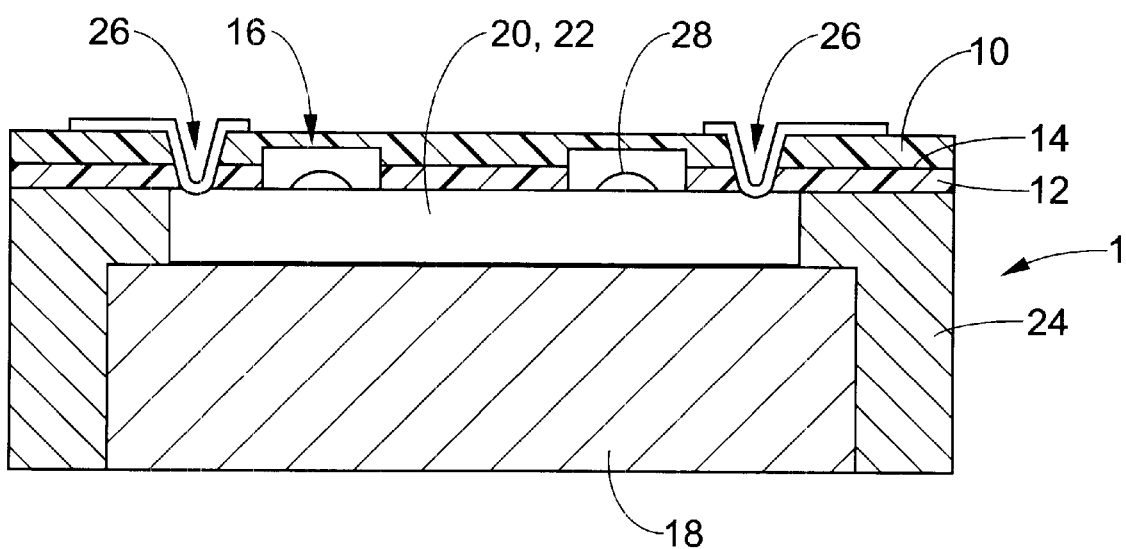
FIG. 1 is a representative chip utilizing the present epoxy adhesive.

An epoxy based adhesive formulation has been developed for various applications. One particular use is for high density interconnected multichip modules. The adhesive is designed to be laser ablatable after the steps of coating the adhesive onto a substrate and removal of solvent. Additionally, the adhesive is designed to be wet or tacky at room temperature to aid in the manufacturing of an electronic chip. Laser ablation is preferred as a method of removing adhesive from areas on the chip which may be sensitive to adhesive. The present adhesive ablates with minimal soot, provides minimal encroachment into the ablated regions, and provides good chip adhesion with minimal movement and voiding over non-ablated areas.

Electronic chips can be bonded to a film using the adhesive. The adhesive is an epoxy based adhesive including epoxidized cashew nutshell liquid, diglycidyl ether of bisphenol A, and at least one each of a curing agent, a bonding enhancer, a hardener, a flexibilizer, a catalyst, and a tackifier. The present adhesive provides an increased shelf life for the mixed adhesive and for partially cured adhesive after a coating step. Additionally, the present adhesive provides low soot generation if a laser ablation step is performed, and less chip movement and adhesive encroachment into ablated openings during adhesive cure.

Epoxidized cashew nutshell liquid is formed by the epoxidation of cashew nutshell liquid with organic compounds containing a three-membered oxide ring known as epoxy, oxirane, or ethoxyline group. The simplest compound useful in the epoxidation reaction is ethylene oxide. Other useful compounds include substantial ethylene oxides such as propylene oxide, phenyl glycidyl ether, glycidyl chloride (epichlorohydrin), vinyl-cyclohex-3-ene dioxide, and mixtures thereof. Epichlorohydrin is preferred due to ease of processability and high availability. Epichlorohydrin is reacted in an excess of about 10 molar times the amount of cashew nutshell liquid. The reaction is carried out in an alkaline medium, and the excess epichlorohydrin can be distilled off after reaction. The epoxidized cashew nutshell liquid has an equivalent weight of around 250 to 450 g/equivalent, or one reactive epoxide group per 250–450 g of the epoxidized cashew nutshell liquid.

The main component in processed cashew nutshell liquid (CNSL) is cardanol, a naturally occurring metasubstituted alkenyl phenol similar to nonylphenol.

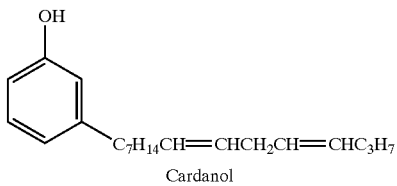
Cardanol

Cardanol is hydrophobic in nature and remains flexible and liquid at very low temperatures. CNSL can be used as a resin modifier, as a phenolic compound shown above, or it can be epoxidized through the phenolic group to make an epoxy resin which can be used in an epoxy mixture. An epoxy version is shown below.

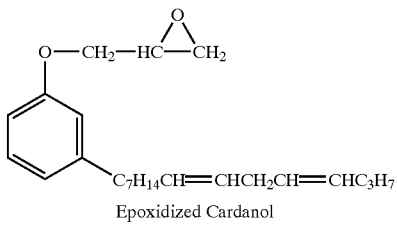
Epoxidized Cardanol

Preferred epoxidized cashew nutshell liquids are available under the code EDP 072 by SIP Industries, LTD., Chennai, India, and by Rishabh resins, Hyderabad, India.

Derivatives of cashew nutshell liquid, such as phenolic polyamines are also contemplated as useful in the present invention. In fact, references to cashew nutshell liquid throughout the specification and claims are intended to include CNSL derivatives. Suitable derivatives are available from Royce (East Rutherford, N.J.) and are sold under the name RA 951 and RA 950.

Epoxidized cashew nutshell liquid is preferably included in the present adhesive composition in an amount between about 5 and 25% by weight of the total composition, more preferably between about 9 and 16%.

A diglycidyl ether of bisphenol A can be formed by reacting bisphenol A with epichlorohydrin or other glycidyl ethers by methods known in the art. Preferred glycidyl ether groups for reaction with bisphenol A include butyl glycidyl ether, $C_8$–$C_{10}$ and $C_{12}$–$C_{14}$ aliphatic monoglycidyl ether, cresyl glycidyl ether, neopentyl glycol diglycidyl ether, and mixtures thereof. Preferred examples are liquid at room temperatures and become solid and tacky as a crosslinking reaction is carried out. Exemplary diglycidyl ethers of bisphenol A, such as Cy-184 and Cy-179, are available from CIBA GEIGY. The resultant bifunctional epoxy is included in the present adhesive composition in an amount between about 5 and 25% by weight, more preferably between about 6 and 12% by weight.

Other di-epoxy materials may also be added to the adhesive formulation to help optimize both the solution properties and final cured film properties. For example, room temperature liquid diepoxides based on cycloaliphatic compounds can be used, such as CY-184 and CY-179 (CIBA GEIGY). Addition of these materials will increase the tackiness of partially cured cast films and provide cured films with higher glass transition temperature (Tg). Di-epoxy flexiblizing agents based on epoxidized glycol ethers may also be added, such as DER-732 and DER-736 (Dow Chemical Company, Midland, Mich.). These materials preferably lower the Tg of the cured adhesive film and provide a more flexible film.

The bifunctional epoxy components are included in the present adhesive composition in an amount between about 5 and 25% by weight, more preferably between about 6 and 12% by weight.

Bonding enhancers are preferably added to the present adhesive composition to improve the interaction of the components within the composition. Preferred bonding enhancers are multifunctional epoxies. More preferably, the bonding enhancers are epoxies with at least about 3 epoxy moieties within the compound. Exemplary bonding enhancers include N,N"-diglycidyl-p-aminophenyl-glycidyl ether, triglycidyl p-aminophenol derived resins, 1,3,5-triglycidyl isocyanurate, tetraglycidylmethylenedianiline, and glycidyl ether of novolac epoxies. The bonding enhancers are preferably added to the present adhesive composition in an amount between about 3 and 30% by weight of the total composition, more preferably between about 9 and 26 wt %.

A curing agent is also preferably added to the present composition. The curing agent serves to crosslink the resultant epoxy composition. The curing agent is preferably a multifunctional organic compound capable of reacting with the epoxy functionalities located within the composition. Preferred curing agents include amines, amides, phenols, thiols, carboxylic acids, carboxylic anhydrides, and mixtures thereof. The most preferred curing agents are anhydrides, and examples of exemplary curing agents include cis -1,2-cyclo hexane dicarboxylic anhydride, methylhexohydropthalic anhydride, and mixtures thereof. The curing agents are preferably added to the present adhesive composition in an amount between about 2 and 14 wt % of the total composition, more preferably between about 4 and 11 wt %.

Hardeners may also be added to the present adhesive composition to improve the curing reaction. Preferred hardeners are amine hardeners. Exemplary amine hardeners include isophoronediamine, triethylenetetraamine, diethylenetriamine, aminoethylpiperazine, 1,2- and 1,3-diaminopropane, 2,2-dimethylpropylenediamine, 1,4-diaminobutane, 1,6-diaminohexane, 1,7-diaminoheptane, 1,8-diaminooctane, 1,9-diaminononae, 1,12-diaminododecane, 4-azaheptamethylenediamine, N,N"-bis (3-aminopropyl)butane-1,4-diamine, cyclohexanediamine, dicyandiamine, diamide diphenylmethane, diamide diphenylsulfonic acid (amine adduct), 4,4"-methylenedianiline, diethyltoluenediamine, m-phenylene diamine, melamine formaldehyde, tetraethylenepentamine, 3-diethylaminopropylamine, 3,3"-iminobispropylamine, 2,4-bis (p-aminobenzyl)aniline, tetraethylenepentamine, 3-diethylaminopropylamine, 2,2,4- and 2,4,4-trimethylhexamethylenediamine, 1,2- and 1,3-diaminocyclohexane, 1,4-diamino-3,6-diethylcyclohexane, 1,2-diamino-4-ethylcyclohexane, 1,4-diamino-3,6-diethylcyclohexane, 1-cyclohexyl-3,4-dimino-cyclohexane, 4,4"-dimiondicyclohexylmethane, 4,4"-diaminodicyclohexylpropane, 2,2-bis(4-aminocyclohexyl) propane, 3,3"-dimethyl-4,4"diamiondicyclohexylmethane, 3-amino-1-cyclohexaneaminopropane, 1,3- and 1,4-bis (aminomethyl)cyclohexane, m- and p-xylylendiamine, and mixtures thereof. A particularly preferred amine hardeners is melamine formaldehyde. The hardening agent is preferably added to the present adhesive composition in an amount between about 4 and 20 wt % of the total composition, more preferably between about 6 and 15 wt. %.

Flexibilizing components are also preferably added to the present adhesive composition to better function as a chipon-flex adhesive. Preferred flexibilizers contain substantially no carbon. Low carbon content flexibilizers are preferred to limit the later formation of soot if the applied composition is laser ablated. Suitable flexibilizers include silicone polymer additives, including fumed and unfumed silica, alumina polymer additives, including fumed and unfumed alumina, polysulfide rubbers, and mixtures thereof. Flexibilizers typically used in polyurethane systems are also suitable. Flexibilizers are preferably added to the present adhesive composition in an amount between about 3 and 20 wt % of the total composition, more preferably between about 5 and 10 wt %.

The curing reaction of the present adhesive is preferably carried out by the addition of a catalyst. Preferred catalysts are substances that contain an unshared pair of electrons in an outer orbital, including Lewis Bases such as tertiary amines, imidazoles, and imidazolines. Exemplary catalysts include 2-ethyl-4-methyl-imidazole, N-(3-aminopropyl) imidazole, 2-phenyl-2-imidazoline, and mixtures thereof. The selected catalysts are added to the present adhesive composition in an amount between about 0.05 and 1.0 wt % of the total composition, more preferably between about 0.1 and 0.3 wt %.

A tackifier may be added to the adhesive composition. The tackifier can be added to improve holding power and thermal resistance. Preferred tackifiers are thermoset resins such as phenolics and melamines. Especially preferred tackifiers are carboxyl terminated compounds. Exemplary tackifying agents include melamine formaldehyles, urea formaldehydes, phenol formaldehydes, epoxidized ortho cresol novolacs, and mixtures thereof. Tackifiers can be added to the present composition in an amount between about 5 and 20 wt % of the total composition, more preferably between about 6 and 15 wt %.

Fillers may be optionally added to the adhesive composition. Suitable fillers are those with substantially no carbon. Low carbon content fillers are preferred to limit the formation of soot if a later laser ablation step is performed. Suitable fillers include inorganic compounds, such as metallic leafing powders, precipitated carbonate, zircon silicate flour, inert fillers, such as $TiO_2$, $Al_2O_3$, $SiO_2$, and coloring dyes and pigments such as ultamarine blue, phthalocyanine blue, fluorescent dyes and brighteners, and mixtures thereof. The various fillers can be added in amounts known to the skilled artisan to achieve the desired modifications to the final product.

The adhesive composition can be formed by mixing the components at temperatures less than about 100° C. under atmospheric pressure. The components are preferably mixed to a homogeneous, bubble-free state. After mixing, the composition may be filtered using gravity or vacuum filtration through a porous filter paper. After filtration, the composition may be placed under a vacuum to carry out an optional degassing step. The adhesive composition may then be stored in bottles at or below room temperature.

The adhesive composition can be advantageously used in electronic applications. For example, the adhesive composition can be used in chip-on-flex applications, wherein an electrical chip is attached to a flexible substrate, such as a polyimide film. Such an attachment provides a high density interconnect package. The adhesive layer is preferably between about 0.008 and 0.025 mm thick, more preferably between about 0.01 and 0.015 mm thick. During the attachment step, the adhesive layer is wet or tacky in a temperature range of about 70–80° C. for at least about 10 minutes, preferably for between about 10 and 20 minutes. At high temperature ranges, i.e. between about 150 and 180° C., the crosslinking reaction is activated, forming the desired attach between chip and substrate.

Before the chip has been attached to the film by the present adhesive, the adhesive layer is optionally laser ablated. The ablation mechanism may be photochemical, thermal, or a combination of both. Preferred laser wavelengths are in the range of 100 to 400 nm, more preferably in the range of 240 to 360 nm. Lower wavelengths are preferred as they generally produce less soot.

FIG. 1 is a cross-section of a high density interconnect (HDI) structure 1. The HDI structure 1 includes underlying polyimide layer 10, an adhesive layer 12 having an upper surface 14, an ablated region 16, a heat-spreading shim 18 attached to the semiconductor chip 20 or 22, and a encapsulant 24. Also illustrated in FIG. 1 are a pair of electrically conductive vias 26 extending through the film 10 and adhesive 12 to make contact with electrodes of chip 20 or 22. Also in FIG. 1, an air bridge 28 associated with the chip 20 or 22 represents the pressure-sensitive structure protected by an air pocket 16.

In the following, the present invention will be described in more detail with reference to non-limiting examples. These examples are for the purposes of illustration only and should not be construed in any limiting sense.

EXAMPLES

Table 1 provides a list of components in representative adhesive compositions consistent with the present invention. Examples 1 and 5 are comparative examples with no epoxidized cashew nutshell liquid. Examples 2–4 are adhesive formulations including epoxidized cashew nutshell liquid.

TABLE 1

Representative Adhesive Compositions

| Constituents (pbw) | 1 (comp) | 2 | 3 | 4 | 5 (comp) |
|---|---|---|---|---|---|
| Epoxy-Novolac ECN 1273 | 9.01 | 25.46 | 24.08 | 13.37 | 26.30 |
| Hexahydropthalic anhydride | 4.73 | 7.07 | 9.24 | 6.87 | 10.67 |
| Epoxidized cashew nutshell liquid EEW, 250–450 g/eq | 0.00 | 10.73 | 9.69 | 15.44 | 0.00 |
| Epoxy resin EPON 828 | 3.65 | 3.39 | 0.00 | 0.00 | 3.29 |
| Cycloaliphatic epoxy resin CY 184 | 3.65 | 3.10 | 3.57 | 2.42 | 2.61 |
| Melamine formaldehyde CYMEL 303 | 12.79 | 11.95 | 14.39 | 13.51 | 6.87 |
| UV-initiator UVI 6976 | 1.46 | 1.84 | 2.18 | 1.54 | 3.08 |
| Ethyldimethoxyanthracene | 0.36 | 1.32 | 0.36 | 0.27 | 1.51 |
| Glycidoxypropyltri-methoxysilane | 0.73 | 1.09 | 0.72 | 0.62 | 1.08 |
| Fumed silica TS 720 Cab-O-Sil | 1.83 | 1.67 | 1.75 | 1.43 | 1.52 |
| Solvent blue 036 | 3.29 | 0.05 | 0.06 | 0.12 | 0.05 |
| PGMEA solvent | 36.54 | 32.18 | 30.96 | 29.73 | 30.58 |
| Imicure EMI 24 | 0.30 | 0.14 | 0.19 | 0.19 | 0.20 |
| Tetraglycidylmethylene-dianiline MY720 of CIBA | 10.60 | 0.00 | 2.81 | 3.94 | 0.00 |
| Epoxidized polybutadiene bd 605 | 10.96 | 0.00 | 0.00 | 10.53 | 12.24 |

Each of the compositions in the above example were separately applied to multiple ceramic substrates to a partial cured thickness of about 15 to 20 microns by spin coating and baking at 70° C. for 15 minutes. Silicon chips, approximately 1 cm square, were applied to the adhesive coated samples periodically, over a time interval of 24 hours. After application of a chip to a substrate, the adhesive was cured and adhesion was measured using a shear tester. Good adhesion was acknowledged if the silicon die fractured before releasing from the adhesive. All compositions provided good adhesive properties if the partial cured films were fully cured within 6 hours or less of preparation. Compositions 2, 3, and 4, which had the epoxidized cashew nut shell liquid present, provided a longer working life of the partially cured films, with good adhesion of components attached to it for up to 24 hours prior to fully curing the film.

A list of manufactures is provided in Table 2.

TABLE 2

Manufacturers of Components in Representative Adhesive Compositions

| Constituents | Manufacturer |
| --- | --- |
| Epoxy-Novolac ECN 1273 | Ciba Specialty Chemicals, Performance Polymers, USA |
| Hexahydropthalic anhydride | Ciba Specialty Chemicals, Ciba Plastics Division, USA |
| Epoxidized cashew nutshell liquid EEW, 250–450 g/eq | SIP Industries, LTD., Chennai, India, Rishabh resins, Hyderabad, India. Royce, USA (RA 951 and RA 950.) |
| Epoxy resin EPON 828 | Shell Chemicals, USA |
| Cycloaliphatic epoxy resin CY 184 | Ciba Specialty Chemicals, Ciba Plastics Division, USA |
| Melamine formaldehyde CYMEL 303 | Cytec Industries Inc., USA |
| UV-initiator UVI 6976 | Union Carbide, Specialty Polymers and Products Division, USA |
| Ethyldimethoxyanthracene | Aldrich Chemical, Milwaukee, WI |
| Glycidoxypropyltrimethoxysilane | United Chemical Technologies, USA |
| Fumed silica TS 720 Cab-O-Sil | Cabot Corporation |
| Solvent blue 036 | Ciba Specialty Chemicals, Ciba Plastics Division, USA |
| PGMEA solvent | Aldrich Chemical, Milwaukee, WI |
| Imicure EMI 24 | Aldrich Chemical, Milwaukee, WI |
| Tetraglycidylmethylenedianiline MY720 of CIBA | Ciba Specialty Chemicals, Performance Polymers, USA |
| Epoxidized polybutadiene bd 605 | elf-atochem |

Although the invention has been described with reference to the exemplary embodiments, various changes and modifications can be made without departing from the scope and spirit of the invention. These modifications are intended to fall within the scope of the invention, as defined by the following claims.

What is claimed is:

1. An adhesive composition comprising;
   a. epoxidized cashew nutshell liquid,
   b. diglycidyl ether of bisphenol A
   c. at least one catalyst,
   d. at least one curing agent selected from the group consisting of hexahydrophthalic anhydrides, methyl hexahydrophthalic anhydrides, and mixtures thereof, and
   e. at least one additional additive chosen from the group consisting of a bonding enhancer, a hardener, a flexibilizer, a tackifier, and mixtures thereof.

2. The composition of claim 1 including said bonding enhancer comprised of a multifunctional epoxy.

3. The composition of claim 1 including said hardener comprised of an amine hardener.

4. The composition of claim 1 including said flexibilizer comprised of an additive selected from the group consisting of silicone polymer additives, polyurethanes, polysulfide rubbers, and mixtures thereof.

5. The composition of claim 1 wherein said catalyst comprises a substituted imidazole.

6. The composition of claim 5, wherein said substituted imidazole is selected from the group consisting of 2-ethyl-4-methyl imidazole, 2-phenyl-2-imidazoline and mixtures thereof.

7. The composition of claim 1 including said tackifier comprised of a thermoset resin.

8. The composition of claim 1 further comprising at least one coloring pigment substantially free of carbon.

9. The composition of claim 1 further comprising at least one filler substantially free of carbon.

10. An adhesive formulation suitable for curing comprising:
    a. epoxidized cashew nutshell liquid,
    b. diglycidyl ether of bisphenol A,
    c. a curing agent selected from the group consisting of hexahydrophthalic anhydrides, methyl hexahydrophthalic anhydrides, and mixtures thereof,
    d. at least one additional additive selected from the group consisting of a bonding enhancer, a hardener, a flexibilizer, a tackifier, and mixtures thereof.

11. An adhesive composition comprising the reaction product of:
    a. epoxidized cashew nutshell liquid,
    b. diglycidyl ether of bisphenol A,
    c. a curing agent selected from the group consisting of hexahydrophthalic anhydrides, methyl hexahydrophthalic anhydrides, and
    d. a catalyst.

12. The reaction product of claim 11 wherein said catalyst comprises a substituted imidazole.

13. The reaction product of claim 12 wherein the substituted imidazole is selected from the group consisting of 2-ethyl-4-methyl imidazole, 2-phenyl-2-imidazoline, and mixtures thereof.

14. The composition of claim 11 wherein said reaction product is formed via a mixing step at a temperature less than about 100° C.

15. A method for forming an adhesive composition comprising the step of mixing together:
    a. epoxidized cashew nutshell liquid,
    b. diglycidyl ether of bisphenol A,
    c. at least one additive selected from the group consisting of curing agents, bonding enhancers, hardeners, flexibilizers, tackifiers, and mixtures thereof, and
    d. adding a catalyst.

16. The method of claim 15 wherein said mixing step is carried out at a temperature less than about 100° C.

17. An electronic chip package comprising:
    a. an adhesive comprised of epoxidized cashew nutshell liquid, diglycidyl ether of bisphenol A, a curing agent, and a catalyst,
    b. an electronic chip, and
    c. a substrate, wherein said epoxy adhesive at least partially secures said chip to said substrate.

18. The chip package of claim 17, wherein said substrate comprises a polyimide film.

* * * * *